United States Patent
Itano (10) Patent No.: US 8,547,446 B2
(45) Date of Patent: Oct. 1, 2013

(54) FULLY-DIFFERENTIAL AMPLIFIER, PHOTOELECTRIC CONVERSION APPARATUS INCLUDING FULLY-DIFFERENTIAL AMPLIFIER, AND IMAGE-PICKUP SYSTEM

(75) Inventor: Tetsuya Itano, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 231 days.

(21) Appl. No.: 12/911,645

(22) Filed: Oct. 25, 2010

(65) Prior Publication Data
US 2011/0096186 A1 Apr. 28, 2011

(30) Foreign Application Priority Data
Oct. 26, 2009 (JP) ................................. 2009-245812

(51) Int. Cl.
*H04N 5/235* (2006.01)

(52) U.S. Cl.
USPC .......................... 348/222.1; 330/253; 330/254

(58) Field of Classification Search
USPC ............................... 348/222.1; 330/253, 254
See application file for complete search history.

(56) References Cited

U.S. PATENT DOCUMENTS

| 6,477,099 B2* | 11/2002 | Fischer et al. ................. 365/207 |
| 7,248,106 B2* | 7/2007 | Draxelmayr ...................... 330/9 |
| 2003/0141923 A1* | 7/2003 | Liu et al. ........................ 327/538 |
| 2005/0270071 A1* | 12/2005 | Draxelmayr ...................... 327/9 |
| 2008/0062295 A1 | 3/2008 | Fujimura |
| 2010/0052644 A1* | 3/2010 | Ide ................................ 323/313 |

FOREIGN PATENT DOCUMENTS

| JP | 62-094005 A | 4/1987 |
| JP | 2003-229735 A | 8/2003 |
| JP | 2004-320440 A | 11/2004 |
| JP | 2008-067064 A | 3/2008 |

* cited by examiner

*Primary Examiner* — Tuan Ho
*Assistant Examiner* — Fayez Bhuiyan
(74) *Attorney, Agent, or Firm* — Canon USA Inc. IP Division (57) ABSTRACT

In a known fully-differential amplifier, it has been difficult to set a power voltage VDD to a low level while maintaining the signal amplitude and increase the amplitude of an output signal without increasing the power voltage VDD. The present invention provides a fully-differential amplifier including a voltage-current conversion unit, a first current-voltage conversion unit, and a second current-voltage conversion unit, where a resistance element included in the voltage-current conversion unit, a resistance element included in the first current-voltage conversion unit, and a resistance element included in the second current-voltage conversion unit are connected in parallel with one another.

12 Claims, 8 Drawing Sheets

FULLY-DIFFERENTIAL AMPLIFIER, PHOTOELECTRIC CONVERSION APPARATUS INCLUDING FULLY-DIFFERENTIAL AMPLIFIER, AND IMAGE-PICKUP SYSTEM

BACKGROUND OF THE INVENTION

1. Field of the Invention

The present invention relates to a fully-differential amplifier, and more particularly relates to a fully-differential amplifier used for an output circuit of a photoelectric conversion apparatus.

2. Description of the Related Art

Due to an increasing demand for the resolution of solid-state image pickup devices, increasing the number of pixels that are provided in the solid-state image pickup devices is an important issue. Since the pixel size has been decreased to increase the number of pixels, the size of each of elements that are included in the solid-state image pickup devices has also been decreased. Further, the power voltage has been decreased to solve the problem of a decrease in the dielectric strength voltage of the element, the decrease being caused by the decreased element size, and an increase in the power consumption, the increase being caused by the increased number of pixels.

Figure 8:
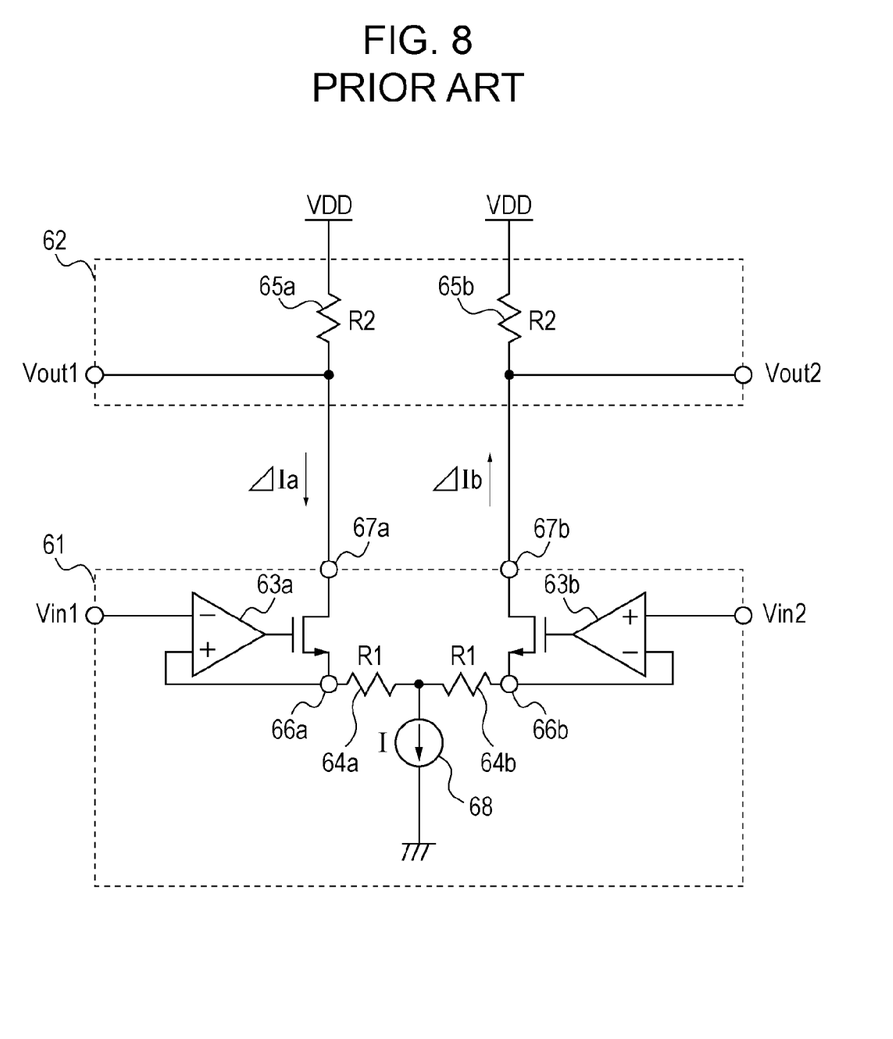
FIG. 8 illustrates FIG. 3 of Japanese Patent Laid-Open No. 2008-067064.

An interface to a signal-processing unit provided to process an output signal transmitted from a solid-state image-pickup apparatus, the interface being configured in a differential manner, has been disclosed in Japanese Patent Laid-Open No. 2008-067064. FIG. 8 is FIG. 3 of Japanese Patent Laid-Open No. 2008-067064. A fully-differential amplifier used in the solid-state image-pickup apparatus, which is disclosed in Japanese Patent Laid-Open No. 2008-067064, will be described with reference to FIG. 8.

According to a configuration illustrated in FIG. 8, when a differential signal is transmitted to an inverting input terminal Vin1 and a non-inverting input terminal Vin2, a differential current having a resistance value R1 as coefficient passes through resistances 64*a* and 64*b*. That is to say, a voltage input is converted into a current through the resistances 64*a* and 64*b*.

Since the above-described differential current passes through resistances 65*a* and 65*b*, an output signal transmitted from the fully-differential amplifier is obtained as a voltage signal due to a voltage drop caused by the resistances 65*a* and 65*b*. That is, a current signal is converted into the voltage signal. The above-described fully-differential amplifier allows for determining a gain for an input signal based on the ratio between the resistance value R1 of the resistances 64*a* and 64*b*, and a resistance value R2 of the resistances 65*a* and 65*b*. Therefore, it is described that even though each of the resistance values R1 and R2 is changed due to manufacture variations, the amplification gain is not affected by the above-described change.

According to the configuration of the fully-differential amplifier illustrated in FIG. 8, the resistances 64*a* and 64*b* that are included in a voltage-current conversion unit 61 are in series with the individual resistances 65*a* and 65*b* that are included in a current-voltage conversion unit. Since a plurality of resistances is connected in series with respect to a path extending from a power voltage VDD to a ground voltage, a voltage drop occurring due to the above-described resistances limits the voltage range of output terminals Vout1 and Vout2. Therefore, it has been difficult to set the power voltage VDD to a low level while maintaining the signal amplitude and increase the amplitude of an output signal without increasing the power voltage VDD through the use of the configuration disclosed in Japanese Patent Laid-Open No. 2008-067064.

SUMMARY OF THE INVENTION

Accordingly, the present invention has been achieved to provide a fully-differential amplifier capable of setting a power voltage VDD to a low level and increasing the amplitude of an output signal with facility.

Further, the present invention provides a fully-differential amplifier provided with a positive-phase input terminal, a negative-phase input terminal, a positive-phase output terminal, and a negative-phase output terminal, where the fully-differential amplifier includes a positive-phase input transistor having a gate terminal connected to the positive-phase input terminal, a negative-phase input transistor having a gate terminal connected to the negative-phase input terminal, first and second resistance elements that are provided to establish a connection between a source terminal of the positive-phase input transistor and a source terminal of the negative-phase input transistor, a third resistance element provided to connect the source terminal of the positive-phase input transistor to the positive-phase output terminal, and a fourth resistance element provided to connect the source terminal of the negative-phase input transistor to the negative-phase output terminal, wherein the first and third resistance elements are connected in parallel with each other between the source terminal of the positive-phase input transistor and a power terminal, and wherein the second and fourth resistance elements are connected in parallel with each other between the source terminal of the negative-phase input transistor and a power terminal.

The present invention allows for setting a power voltage VDD transmitted to a fully-differential amplifier to a low level and/or increasing the amplitude of an output signal of the fully-differential amplifier with facility.

Further features of the present invention will become apparent from the following description of exemplary embodiments with reference to the attached drawings.

DESCRIPTION OF THE EMBODIMENTS

Embodiments of the present invention will be described with reference to the attached drawings.

First Embodiment

Figure 1:
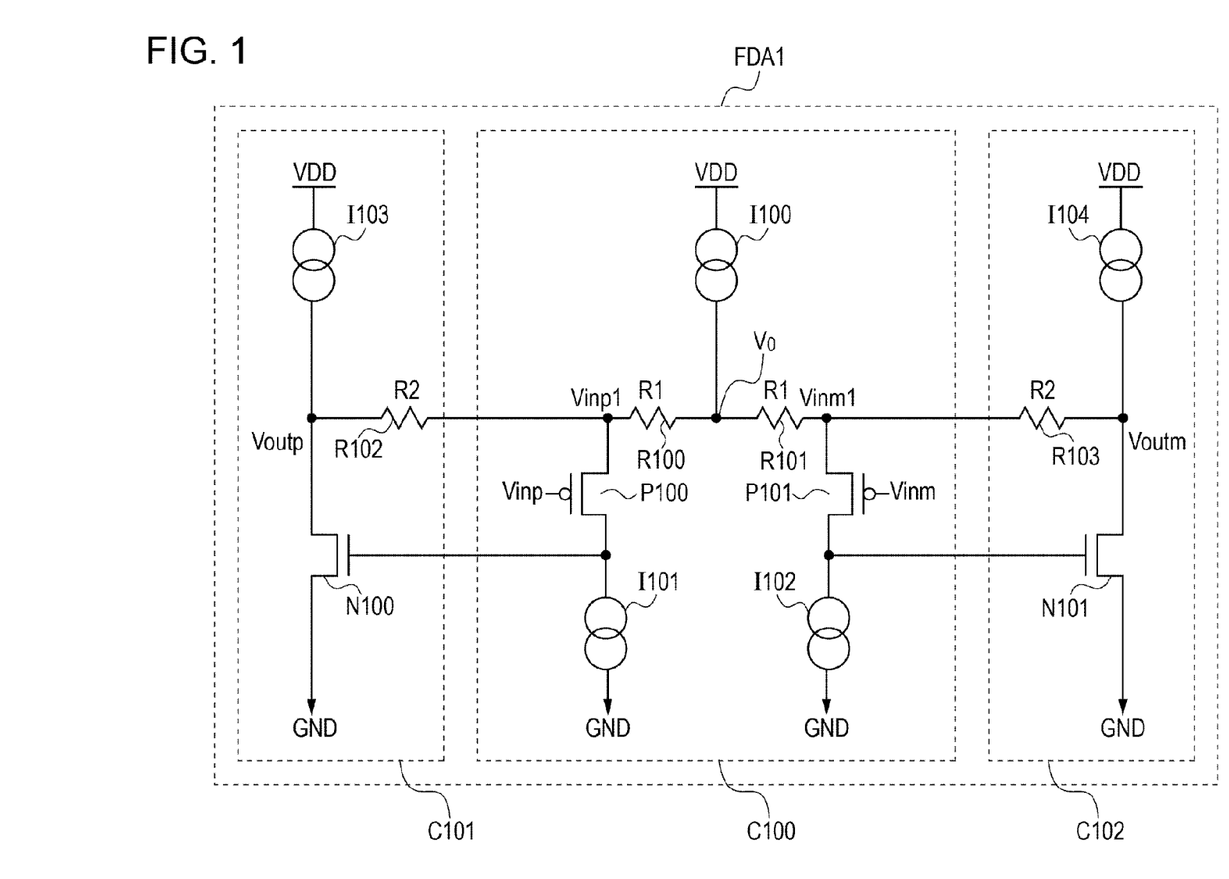
FIG. 1 illustrates an exemplary configuration of a fully-differential amplifier according to a first embodiment of the present invention.

FIG. 1 illustrates an exemplary configuration of a fully-differential amplifier according to a first embodiment of the present invention. A fully-differential amplifier FDA1 includes a voltage-current conversion unit C100, a first current-voltage conversion unit C101, and a second current-conversion unit C102.

The voltage-current conversion unit C100 includes a positive-phase input transistor P100, a negative-phase input transistor P101, a constant-current sources I100, I101, and I102, and resistance elements R100 and R101. The characteristics of the positive-phase input transistor P100 are equivalent to those of the negative-phase input transistor P101. Further, the constant-current sources I100, I101, and I102 have the individual current values $2I_0$, $I_0$, and $I_0$. The value of each of currents flowing through the constant-current sources I103 and I104 may be arbitrarily determined. The gate terminals (control electrodes) of the positive-phase input transistor P100 and the negative-phase input transistor P101 are individually connected to the positive-phase input terminal and the negative-phase input terminal of the fully-differential amplifier FDA1. A positive-phase input voltage and a negative-phase input voltage are individually given to the positive-phase input terminal and the negative-phase input terminal. The drain terminal (one of the main electrodes) of the positive-phase input transistor P100 is connected to one of terminals of the constant-current source I101, and the source terminal (the other main electrode) of the positive-phase input transistor P100 is connected to one of terminals of the resistance element R100. The other terminal of the constant-current source I101 is connected to a ground voltage GND. Further, the drain terminal (one of the main electrodes) of the negative-phase input transistor is connected to one of terminals of the constant-current source I102 and the source terminal (the other main electrode) of the negative-phase input transistor is connected to one of terminals of the resistance element R101. The other terminal of the constant-current source I102 is connected to a ground voltage GND. The other terminal of the resistance element R100 is connected to the other terminal of the resistance element R101 and one of terminals of the constant-current source I100. The other terminal of the constant-current source I100 is connected to a power voltage VDD via a power terminal. Each of the resistance elements R100 and R101 has a resistance value R1 and are connected between the source terminals of the positive-phase input transistor P100 and the negative-phase input transistor P101.

A first current-voltage conversion unit C101 includes the constant-current source I103, the resistance element R102, and an n-channel metal-oxide semiconductor (NMOS) transistor N100. The source terminal (one of the main electrodes) of the NMOS transistor N100 is connected to a ground voltage GND, and the drain terminal (the other main electrode) of the NMOS transistor N100 is connected to one of terminals of the constant-current source I103 and one of terminals of the resistance element R102. The other terminal of the constant-current source I103 is connected to a power voltage VDD via a power terminal. The other terminal of the resistance element R102 is connected to one of the terminals of the resistance element R100 and the source terminal of the positive-phase input transistor P100. Further, the gate terminal (the control electrode) of the NMOS transistor N100 is connected to the drain terminal of the positive-phase input transistor P100 and one of terminals of the constant-current source I101. A node to which one of the terminals of the resistance element R102, one of the terminals of the constant-current source I103, and the drain terminal of the NMOS transistor N100 are commonly connected functions as the positive-phase output terminal of the fully-differential amplifier FDA1. Here, the resistance value of the resistance element R102 is determined to be R2.

A second current-voltage conversion unit C102 includes the constant-current source I104, a resistance element R103, and an NMOS transistor N101. The NMOS transistor N101 has the same characteristics as those of the NMOS transistor N100. The source terminal (one of the main electrodes) of the NMOS transistor N101 is connected to a ground voltage GND, and the drain terminal (the other main electrode) of the NMOS transistor N101 is connected to one of terminals of the constant-current source I104 and one of terminals of the resistance element R103. The other terminal of the constant-current source I104 is connected to a power voltage VDD via a power terminal. The other terminal of the resistance element R103 is connected to one of the terminals of the resistance element R101 and the source terminal of the negative-phase input transistor P101. Further, the gate terminal (the control electrode) of the NMOS transistor N101 is connected to the drain terminal of the negative-phase input transistor P101 and one of the terminals of the constant-current source I102. A node to which one of the terminals of the resistance element R103, one of the terminals of the constant-current source I104, and the drain terminal of the NMOS transistor N101 are commonly connected functions as the negative-phase output terminal of the fully-differential amplifier FDA1. Here, the resistance value of the resistance element R103 is determined to be R2.

The above-described ground voltage GND may not necessarily be 0V. That is, the magnitude of the ground voltage GND does not matter so long as the ground voltage GND can be used as a reference voltage.

Next, operations of the fully-differential amplifier FDA1 according to the above-described embodiment will be described.

The potentials of the positive-phase input terminal, the negative-phase input terminal, the positive-phase output terminal, and the negative-phase output terminal are individually determined to be Vinp, Vinm, Voutp, and Voutm. When the potential of an in-phase input is determined to be Vcm, and changes from the potential Vcm of the in-phase input to the individual potentials Vinp and Vinm are determined to be $\Delta Vinp$ and $\Delta Vinm$, the potentials Vinp and Vinm are individually indicated by the following expressions:

$$Vinp = Vcm + \Delta Vinp \quad \text{Equation (1), and}$$

$$Vinp = Vcm + \Delta Vinm \quad \text{Equation (2).}$$

When the source potential of the positive-phase input transistor P100 is determined to be Vinp1 and that of the negative-phase input transistor P101 is determined to be Vinm1, where the sign G indicates a gain, the source potentials Vinp1 and Vinm1 are individually indicated by the following expressions:

$$Vinp1 = Vcm + G \times \Delta Vinp \quad \text{Equation (3), and}$$

$$Vinm1 = Vcm + G \times \Delta Vinm \quad \text{Equation (4).}$$

The gains G are values that are determined based on the individual input transistors P100 and P101. Since the characteristics of the input transistors P100 and P101 are equivalent to each other in the above-described embodiment, the values of the gains G are equivalent to each other. The value of each of the gains G is less than one.

Next, when the potential of the node to which the other terminals of the resistance elements R100 and R101 are commonly connected is determined to be $V_0$, the sum total of currents flowing through the resistance elements R100 and R101 becomes $2I_0$, so that the following equations:

$$(V_0-Vinp1)/R1+(V_0-Vinm1)/R1=2I_0 \quad \text{Equation (5), and}$$

$$V_0=I_0 \times R1+(Vinp1+Vinm1)/2 \quad \text{Equation (6) hold.}$$

When the values of currents flowing through the individual resistance elements R100 and R101 are determined to be Ip and Im, the current values are indicated by the following equations:

$$Ip=(V_0-Vinp1)/R1=I_0-(Vinp1-Vinm1)/(2 \times R1) \quad \text{Equation (7), and}$$

$$Im=(V_0-Vinm1)/R1=I_0-(Vinp1-Vinm1)/(2 \times R1) \quad \text{Equation (8).}$$

Since the resistance element R100 is connected to the constant-current source I101 via the positive-phase input transistor P100, a first intermediate current which is the difference between current values Ip and $I_0$ is injected into the resistance element R102. Further, since the resistance element R101 is connected to the constant-current source I102 via the negative-phase input transistor P101, a second intermediate current which is the difference between the current values Im and $I_0$ is injected into the resistance element R103. Accordingly, the positive-phase output voltage Voutp and the negative-phase output voltage Voutm are indicated by the following expressions:

$$Voutp=Vinp1-(Ip-I_0) \times R2=Vinp1+(Vinp1-Vinm1) \times R2/(2 \times R1) \quad \text{Equation (9), and}$$

$$Voutm=Vinm1-(Im-I_0) \times R2=Vinm1+(Vinp1-Vinm1) \times R2/(2 \times R1) \quad \text{Equation (10).}$$

Therefore, when the voltage corresponding to a difference (the input-difference voltage) between the potential change $\Delta Vinp$ of the positive-phase input terminal and the potential change $\Delta Vinm$ of the negative-phase input terminal is determined to be $\Delta Vin$, and the voltage corresponding to a difference (the output-difference voltage) between the potential change $\Delta Voutp$ of the positive-phase output terminal and the potential change $\Delta Voutm$ of the negative-phase output terminal is determined to be $\Delta Vout$, the following equation:

$$\Delta Vout=Voutp-Voutm=(1+R2/R1) \times (Vinp1-Vinm1)=(1+R2/R1) \times G \times (\Delta Vinp1-\Delta Vinm1)=(1+R2/R1) \times G \times \Delta Vin \quad \text{Equation (11)}$$

holds. That is, the output voltage difference $\Delta Vout$ is expressed as a signal obtained by amplifying the input-difference voltage $\Delta Vin$ at an amplification gain of $(1+R2/R1) \times G$.

According to the fully-differential amplifier FDA1 of the above-described embodiment, the first and third resistance elements are connected in parallel with each other between the source terminal of the positive-phase input transistor P100 and the power terminal, and the second and fourth resistance elements are connected in parallel with each other between the source terminal of the negative-phase input transistor P101 and the power terminal. That is, it becomes possible to reduce the number of resistance elements that are inserted in series into the path extending from the power voltage VDD to the ground voltage GND in the voltage-current conversion unit C100. Further, it becomes possible to reduce the number of resistance elements that are inserted in series into the path extending from the power voltage VDD to the ground voltage GND in each of the first and second current-voltage conversion units C101 and C102. The above-described configuration allows for setting the power voltage VDD to a low level while maintaining the signal amplitude and/or increasing the amplitude of an output signal without increasing the power voltage VDD with facility.

Second Embodiment

Figure 2:
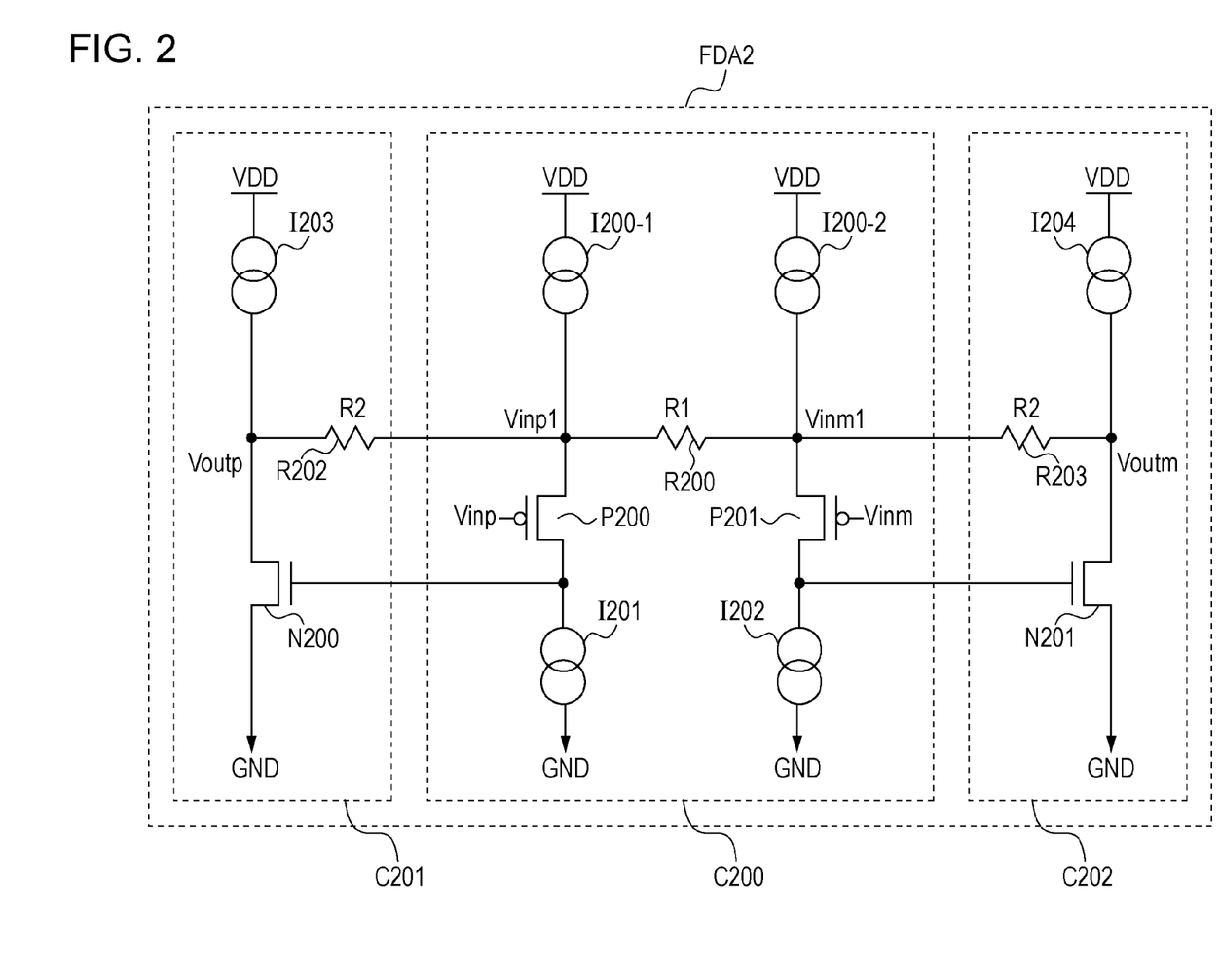
FIG. 2 illustrates an exemplary configuration of a fully-differential amplifier according to a second embodiment of the present invention.

FIG. 2 illustrates an exemplary configuration of a fully-differential amplifier according to a second embodiment of the present invention. A fully-differential amplifier FDA2 includes a voltage-current conversion unit C200, a first current-voltage conversion unit C201, and a second current-voltage conversion unit C202. Hereinafter, the second embodiment will be described focusing on the difference between the first and the second embodiments.

The voltage-current conversion unit C200 includes a positive-phase input transistor P200, a negative-phase input transistor P201, constant-current sources I200-1, I200-2, I201, and I202, and a resistance element R200. Here, the resistance value of the resistance element R200 is determined to be R1. The fully-differential amplifier FDA2 is different from the fully-differential amplifier FDA1 according to the first embodiment in that the same resistance element R200 is provided as the first and second resistance elements.

In the voltage-current conversion unit C200, the characteristics of the positive-phase input transistor P200 are equivalent to those of the negative-phase input transistor P201. Further, the current value of each of the constant-current sources I200-1, I200-2, I201, and I202 is determined to $I_0$. The gate terminals (the control electrodes) of the positive-phase input transistor P200 and the negative-phase input transistor P201 individually function as the positive-phase input terminal and the negative-phase input terminal of the fully-differential amplifier FDA2.

The drain terminal (one of the main electrodes) of the positive-phase input transistor P200 is connected to one of terminals of the constant-current source I201, and the source terminal (the other main electrode) of the positive-phase input transistor P200 is connected to one of terminals of the resistance element R200. The other terminal of the constant-current source I201 is connected to a ground voltage GND. Further, the drain terminal (one of the main electrodes) of the negative-phase input transistor is connected to one of terminals of the constant-current source I202 and the source terminal (the other main electrode) of the negative-phase input transistor is connected to the other terminal of the resistance element R200. The other terminal of the constant-current source I202 is connected to a ground voltage GND. The other terminal of the resistance element R200 is connected to the source terminal of the positive-phase input transistor P200 and one of terminals of the constant-current source I200-1. Further, the other terminal of the resistance element R200 is connected to the source terminal of the negative-phase input transistor P201 and the constant-current source I200-2. The other terminal of each of the constant-current sources I200-1 and I200-2 is connected to a power voltage VDD via a power terminal.

The first current-voltage conversion unit C201 includes a constant-current source I203, a resistance element R202, and an NMOS transistor N200. The source terminal (one of the main electrodes) of the NMOS transistor N200 is connected to a ground voltage GND, and the drain terminal (the other main electrode) of the NMOS transistor N200 is connected to one of terminals of a constant-current source I203 and one of terminals of the resistance element R202. The other terminal of the constant-current source I203 is connected to a power voltage VDD via a power terminal. The other terminal of the resistance element R202 is connected to one of the terminals of the resistance element R200 and the source terminal of the positive-phase input transistor P200. Further, the gate terminal (the control electrode) of the NMOS transistor N200 is connected to the drain terminal of the positive-phase input transistor P200 and one of terminals of the constant-current source I201. A node to which one of the terminals of the resistance element R202, one of the terminals of the constant-current source I203, and the drain terminal of the NMOS transistor N200 are commonly connected functions as the positive-phase output terminal of the fully-differential amplifier FDA2. Here, the resistance value of the resistance element R202 is determined to be R2.

The second current-voltage conversion unit C202 includes a constant-current source I204, a resistance element R203, and an NMOS transistor N201. The NMOS transistor N201 has the same characteristics as those of the NMOS transistor N200. The source terminal (one of the main electrodes) of the NMOS transistor N201 is connected to a ground voltage GND, and the drain terminal (the other main electrode) of the NMOS transistor N201 is connected to one of terminals of the constant-current source I204 and one of terminals of the resistance element R203. The other terminal of the constant-current source I204 is connected to a power voltage VDD via a power terminal. The other terminal of the resistance element R203 is connected to the other terminal of the resistance element R200 and the source terminal of the negative-phase input transistor P201. Further, the gate terminal (the control electrode) of the NMOS transistor N201 is connected to the drain terminal of the negative-phase input transistor P201 and one of the terminals of the constant-current source I204. A node to which one of the terminals of the resistance element R203, one of the terminals of the constant-current source I204, and the drain terminal of the NMOS transistor N201 are commonly connected functions as the negative-phase output terminal of the fully-differential amplifier FDA2. Here, the resistance value of the resistance element R203 is determined to be R2.

Next, operations of the fully-differential amplifier FDA2 according to the above-described embodiment will be described.

As is the case with the first embodiment, the potentials of the positive-phase input terminal and the negative-phase input terminal are individually determined to be Vinp and Vinm, and the in-phase input potential is determined to be Vcm, a potential change from the in-phase input potential Vcm of the positive-phase input terminal is determined to be $\Delta$Vinp, and a potential change from the in-phase input potential Vcm of the negative-phase input terminal is determined to be $\Delta$Vinm. Further, when the potential of the source terminal of the positive-phase input transistor P200 is determined to be Vinp1 and that of the source terminal of the negative-phase input transistor P201 is determined to be Vinm1, as is the case with the first embodiment, the following expressions:

$$Vinp = Vcm + \Delta Vinp \quad \text{Equation (1)},$$

$$Vinp = Vcm + \Delta Vinm \quad \text{Equation (2)},$$

$$Vinp1 = Vcm + G \times \Delta Vinp \quad \text{Equation (3), and}$$

$$Vinm1 = Vcm + G \times \Delta Vinm \quad \text{Equation (4)}$$

hold. The gains G are values that are determined based on the individual transistors P200 and P201. Since the characteristics of the input transistors P200 and P201 are equivalent to each other in the above-described embodiment, the values of the gains G are equivalent to each other. The value of each of the gains G is less than one, as is the case with the first embodiment.

Next, when a direction extending from one of the terminals of the resistance element R200 toward the other terminal of the resistance element R200 is determined to be a positive direction, a current $I_1$ flowing through the resistance element R200 is expressed by the following expression:

$$I_1 = (Vinp1 - Vinm1)/R1 = (\Delta Vinp - \Delta Vinm)/R1 \quad \text{Equation (12)}.$$

Here, one of the terminals of the resistance element R200 is connected to the constant-current source I201 via the positive-phase input transistor P200, and the other terminal of the resistance element R200 is connected to the constant-current source I202 via the negative-phase input transistor P201. Therefore, the current $I_1$ flowing through the resistance element R200 is supplied from the resistance element R202 and ejected into the resistance element R203.

Accordingly, the positive-phase output voltage Voutp and the negative-phase output voltage Voutm are indicated by the following expressions:

$$Voutp = Vinp1 + I_1 \times R2 = Vinp1 + (Vinp1 - Vinm1) \times R2/R \quad \text{Equation (13), and}$$

$$Voutm = Vinm1 - I_1 \times R2 = Vinm1 - (Vinp1 - Vinm1) \times R2/R1 \quad \text{Equation (14)}.$$

Therefore, when the voltage corresponding to a difference between the potential change $\Delta$Vinp of the positive-phase input terminal and the potential change $\Delta$Vinm of the negative-phase input terminal is determined to be $\Delta$Vin, and the voltage corresponding to a difference between the potential change $\Delta$Voutp of the positive-phase output terminal and the potential change $\Delta$Voutm of the negative-phase output terminal is determined to be $\Delta$Vout, the following equation:

$$\Delta Vout = Voutp - Voutm = (1 + 2 \times R2/R1) \times (Vinp1 - Vinm1) = (1 + 2 \times R2/R1) \times G \times (\Delta Vinp1 - \Delta Vinm1) = (1 + 2 \times R2/R1) \times G \times \Delta Vin \quad \text{Equation (15)}$$

holds. That is, the output voltage difference $\Delta$Vout is expressed as a signal obtained by amplifying the input-difference voltage $\Delta$Vin at an amplification gain of $(1 + 2 \times R2/R1) \times G$.

According to the fully-differential amplifier FDA2 of the above-described embodiment, the resistance element R200 functioning as the first and second resistance elements and the third resistance element R202 are connected in parallel with each other between the source terminal of the positive-phase input transistor P200 and the power terminal. Further, the resistance element R200 functioning as the first and second resistance elements and the fourth resistance element R202 are connected in parallel with each other between the source terminal of the negative-phase input transistor P201 and the power terminal. Consequently, it becomes possible to reduce the number of resistance elements that are inserted in series into the path extending from the power voltage VDD to the ground voltage GND in the voltage-current conversion unit C200. Further, it becomes possible to reduce the number of resistance elements that are inserted in series into the path extending from the power voltage VDD to the ground voltage GND in each of the first and second current-voltage conversion units C201 and C202. The above-described configuration allows for setting the power voltage VDD to a low level while maintaining the signal amplitude and/or increasing the amplitude of an output signal without increasing the power voltage VDD with facility.

Further, since the above-described embodiment allows for applying a gain higher than that of the first embodiment, as clarified through Equation (15), the fully-differential amplifier FDA2 is more advantageous than the fully-differential amplifier FDA1 described in the first embodiment.

Third Embodiment

Figure 3:
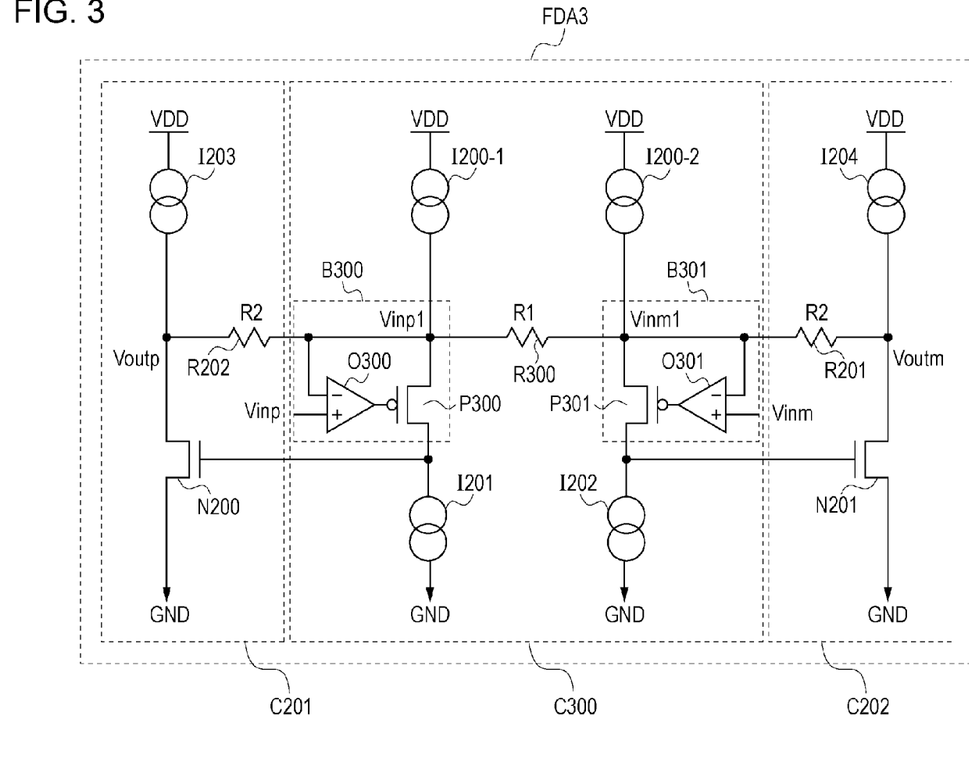
FIG. 3 illustrates an exemplary configuration of a fully-differential amplifier according to a third embodiment of the present invention.

FIG. 3 illustrates an exemplary configuration of a fully-differential amplifier according to a third embodiment of the present invention.

The difference between the above-described fully-differential amplifier and the fully-differential amplifier FDA2 illustrated in FIG. 2 is an input unit of a voltage-current conversion unit C300. More specifically, in a fully-differential amplifier FDA3 of the present embodiment, a positive-phase input terminal is connected to the non-inverting input terminal of an operational amplifier O300, and the operational amplifier O300 and a positive-phase input transistor P300 are included in a voltage follower B300. Further, in the fully-differential amplifier FDA3 of the present embodiment, a negative-phase input terminal is connected to the non-inverting input terminal of an operational amplifier O301, and the operational amplifier O301 and a negative-phase input transistor P301 are included in a voltage follower B301. Here, the operational amplifiers O300 and O301 are individually referred to as a first operational amplifier and a second operational amplifier. The elements that are the same as those in FIG. 2 are shown with the same reference numerals. This also applies to the subsequent embodiments.

According to the above-described configuration, the source potential Vinp1 of the positive-phase input transistor P300 is substantially equal to the positive-phase input Vinp through the voltage follower B300. Likewise, the source potential Vinm1 of the negative-phase input transistor P301 is substantially equal to the negative-phase input Vinm through the voltage follower B301. Therefore, since the expression G=1 holds in Equation (15), the output-difference voltage ΔVout is expressed as the following equation:

$$\Delta Vout = (1+2 \times R2/R1) \times G \times \Delta Vin = (1+2 \times R2/R1) \times \Delta Vin \quad \text{Equation (16)}.$$

That is, it becomes possible to suppress a reduction in the signal amplitude in relation to the configuration of the second embodiment where the value of the gain G is less than one.

According to the fully-differential amplifier FDA3 of the above-described embodiment, it becomes possible to reduce the number of resistance elements inserted in series into the path extending from the power voltage VDD to the ground voltage GND, as is the case with the fully-differential amplifier illustrated in the second embodiment. The above-described configuration allows for setting the power voltage VDD to a low level while maintaining the signal amplitude and/or increasing the amplitude of an output signal without increasing the power voltage VDD with facility.

Additionally, the above-described configuration allows for suppressing a reduction in the signal amplitude in comparison with the configuration illustrated in the second embodiment.

Fourth Embodiment

Figure 4:
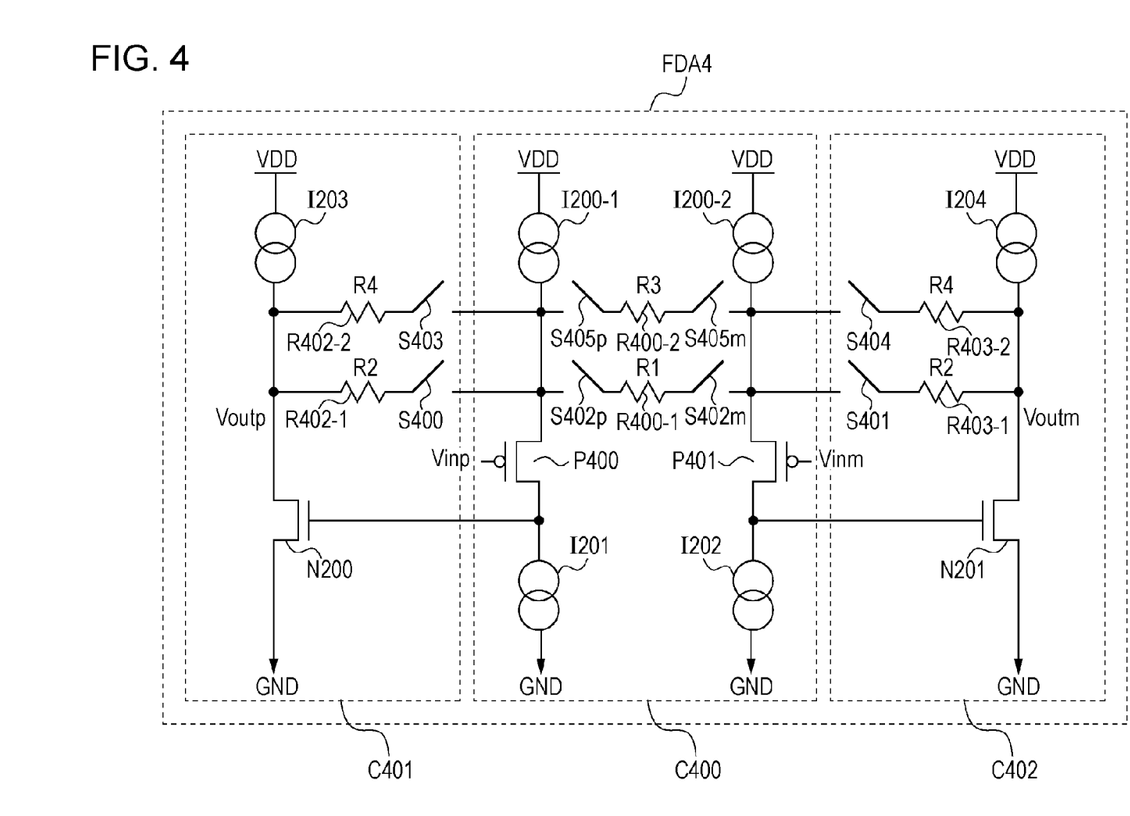
FIG. 4 illustrates an exemplary configuration of a fully-differential amplifier according to a fourth embodiment of the present invention.

FIG. 4 illustrates an exemplary configuration of a fully-differential amplifier according to a fourth embodiment of the present invention.

A first difference between a fully-differential amplifier FDA4 of the present embodiment and the fully-differential amplifier FDA2 illustrated in FIG. 2 is that at least two resistance elements (R400-1 and R400-2) are provided in parallel with each other between the source terminal of a positive-phase input transistor P400 and that of a negative-phase input transistor P401. A second difference between the fully-differential amplifier FDA4 of the present embodiment and the fully-differential amplifier FDA2 is that at least two resistance elements (R402-1 and R402-2) are provided in parallel with each other between the source terminal of the positive-phase input transistor P400 and a positive-phase output terminal Voutp. A third difference between the fully-differential amplifier FDA4 of the present embodiment and the fully-differential amplifier FDA2 is that at least two resistance elements (R403-1 and R403-2) are provided in parallel with each other between the source terminal of the negative-phase input transistor P401 and a negative-phase output terminal Voutm. That is, the resistance elements R400-1 and R400-2 both serving as the first and second resistance elements are provided in parallel with each other with respect to a path provided between the source terminals of the positive-phase input transistor and the negative-phase input transistor. Further, the resistance elements R402-1 and R402-2 are provided, as a third resistance element, in parallel with each other with respect to a path provided between the source terminal of the positive-phase input transistor P400 and the positive-phase output terminal Voutp. Further, the resistance elements R403-1 and R403-2 are provided, as a fourth resistance element, in parallel with each other with respect to a path provided between the source terminal of the negative-phase input transistor P401 and the negative-phase output terminal Voutm.

Switches S400, S401, S402, S403, S404, and S405 are controlled through a control unit (not shown) so that the connection relationships between the resistance elements R400-1, R400-2, R402-1, R402-2, R403-1, and R403-2 can be changed. That is to say, since the resistance value R1 shown in Equation (15) can be set to any one of R1, R3, and R1∥R3, and the resistance value R2 can be set to any one of R2, R4, and R2∥R4, it is possible to make the amplification gain at which the input-difference voltage ΔVin is amplified variable.

In the above-described embodiment, each of the resistance values R1 and R2 that are shown in Equation (15) may be set in three ways. However, each of the resistance values R1 and R2 may be set in four ways and only one of the resistance values R1 and R2 may be set in variable manner. Further, the specific method of making the resistance values of the first to fourth resistance elements variable is not limited to the above-described methods.

The above-described embodiment allows for decreasing the number of the resistance elements that are inserted in series into the path extending from the power voltage VDD to the ground voltage GND in the voltage-current conversion unit C400. Further, the above-described embodiment allows for decreasing the number of the resistance elements that are inserted in series into the path extending from the power voltage VDD to the ground voltage GND in each of the first and second current-voltage conversion units C401 and C402. The above-described configuration allows for setting the power voltage VDD to a low level while maintaining the signal amplitude and/or increasing the amplitude of an output signal without increasing the power voltage VDD with facility.

Additionally, since the above-described embodiment allows for making the amplification gain variable in relation to the configuration illustrated in the second embodiment, the fully-differential amplifier FDA4 of the above-described embodiment is convenient for its use.

Each of the above-described fully-differential amplifiers includes a PMOS transistor provided as an input transistor and the NMOS transistor for the current-voltage conversion unit. However, without being limited to the above-described configuration, the conductive type of each of the transistors may be reversed according to another embodiment of the present invention. In that case, the relationship between the power voltage VDD and the ground voltage GND in each of the above-described fully-differential amplifiers is reversed.

Fifth Embodiment

Figure 5:
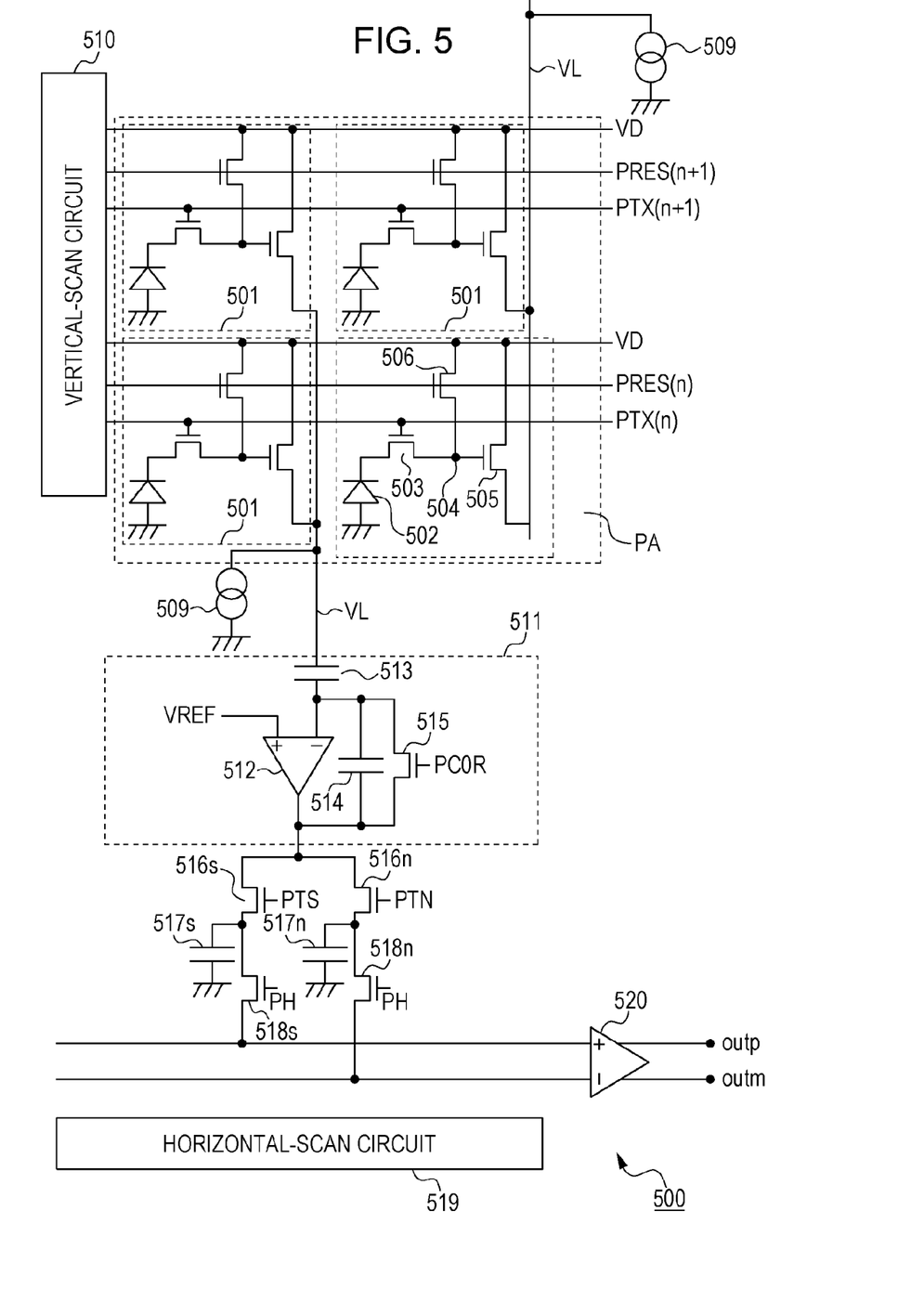
FIG. 5 illustrates an exemplary configuration of a fully-differential amplifier according to a fifth embodiment of the present invention.

FIG. 5 illustrates an exemplary configuration of a photoelectric conversion apparatus according to a fifth embodiment of the present invention.

A photoelectric conversion apparatus 500 provided on a semiconductor substrate includes a pixel array PA where a plurality of unit pixels 501 is arranged in matrix form. In the present embodiment, only four pixels that are included in the n-th row and the n+1st row of the pixel array PA are extracted for the sake of simplification. However, the number of the unit pixels 501 is not limited to this arrangement. For example, the unit pixels 501 may be arranged in one-dimensional form.

The unit pixel 501 includes a photoelectric conversion unit 502, a transfer transistor 503 provided to transfer an electric charge occurring through the photoelectric conversion performed by the photoelectric conversion unit 502 to a floating diffusion unit 504, an amplification transistor 505 provided to amplify and output the voltage of the floating diffusion unit 504, and a reset transistor 506 provided to reset the potential of the floating diffusion unit 504. The drain of each of the amplification transistor 505 and the reset transistor 506 is connected to a common signal line VD. Further, the amplification transistor 505 and a constant-current source 509 are included in a source-follower circuit and the source terminal of the amplification transistor 505 functions as the output terminal of the source-follower circuit.

An output signal of the unit pixel 501, which is transmitted from the source terminal of the amplification transistor 505, is transmitted to a column-amplification unit 511 via a vertical signal line VL. In the above-described embodiment, a plurality of the column amplification units 511 is alternately provided above and under the pixel array PA for each column of pixels. Here, the column amplification unit 511 provided above the pixel array PA and circuits provided thereunder are not shown for the sake of simplification. The column amplification unit 511 includes an operational amplifier 512, an input capacity 513, a feedback capacity 514, and a clamp-control switch 515. One of terminals of the input capacity 513 is connected to the vertical signal line VL as an input terminal of the column-amplification unit 511. The other terminal of the input capacity 513 is connected to the inverting input terminal of the operational amplifier 512 and an output terminal of the operational amplifier 512 via the feedback capacity 514 and the clamp-control switch 515 that are parallel with each other. Further, a reference voltage VREF is transmitted to a non-inverting input terminal of the operational amplifier 512.

The output terminal of the operational amplifier 512, which is an output terminal of the column-amplification unit 511, is connected to a memory 517s via a column-amplifier output transfer switch 516s and a memory 517n via a column-amplifier output transfer switch 516n. The memory 517s is connected to the positive-phase input terminal of a fully-differential amplifier 520 via a horizontal-transfer switch 518s. Further, the memory 517n is connected to the negative-phase input terminal of the fully-differential amplifier 520 via a horizontal-transfer switch 518n.

The fully-differential amplifier 520 may be any one of the fully-differential amplifiers that are described in the first to fourth embodiments.

In the photoelectric conversion apparatus 500, each of signals VD, PRES(n), PRES(n+1), PTX(n), and PTX(n+1) is transmitted from a vertical-scan circuit 510. Each of signals PCLMP, PTS, and PTN is transmitted from a control unit (not shown) such as a timing-generation unit which will be described later, for example. Further, the photoelectric conversion apparatus 500 is configured that a signal PH is transmitted from a horizontal-scan circuit 519.

Figure 6:
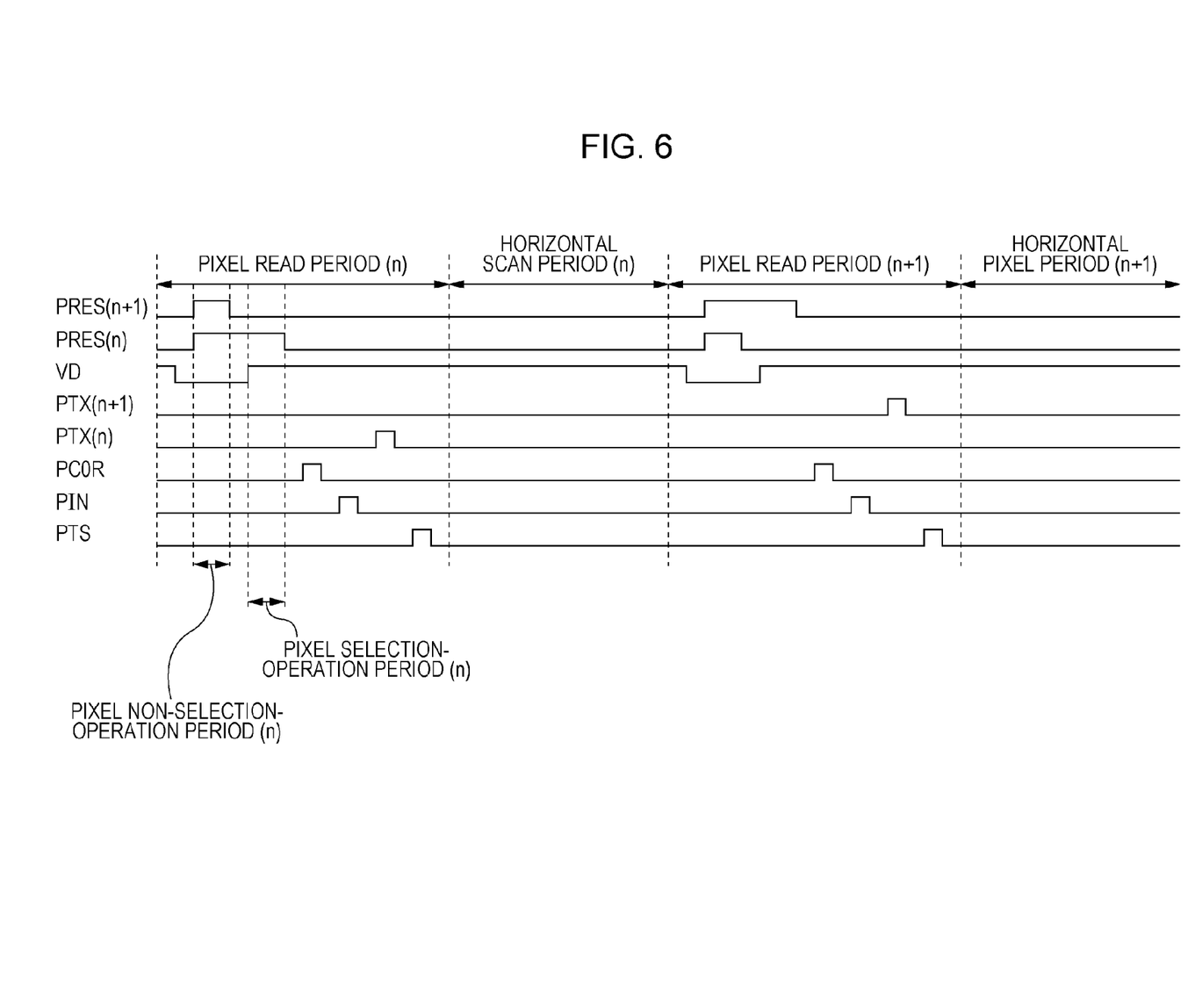
FIG. 6 is a timing chart illustrating the operations of the fully-differential amplifier according to the fifth embodiment.

Next, the operations of the photoelectric conversion apparatus 500 will be described with reference to FIG. 6.

In the photoelectric conversion apparatus 500, the unit pixels corresponding to a single row are selected at one time. The selection of the unit pixels 501 is performed based on the gate-voltage difference of the amplification transistor 505. More specifically, on a row for selection (hereinafter referred to as a selected row), that is, a row on which a signal is read from the unit pixel 501, the reset transistor 506 is brought into conduction in the state where the signal VD is maintained at a high level so that the gate potential of the amplification transistor 505 is raised. On the other hand, on a row for non-selection (hereinafter referred to as a non-selected row), the reset transistor 506 is brought into conduction in the state where the signal VD is maintained at a low level so that the gate potential of the amplification transistor 505 is lowered. Consequently, only the amplification transistor 505 corresponding to the selected row and the constant-current source 509 operate as the source-follower circuit.

First, in a pixel non-selection-operation period (n) of a pixel-reading period (n), each of signals PRES(n) and PRES(n+1) is at a high level in the state where the signal VD is at a low level. Then, only the signal PRES(n+1) is at a low level at the end of the pixel non-selection-operation period (n). Consequently, the gate potential of the amplification transistor 505 of the n+1st row becomes the potential corresponding to the low-level signal VD, so that the pixels corresponding to the n+1st row enter the non-selected state.

After that, the signal VD is changed to a high level in the pixel non-selection-operation period (n), and the signal PRES(n) is shifted to a low level in the above-described state. Consequently, the gate potential of the amplification transistor 505 of the n-th row becomes the potential corresponding to the high-level signal VD, so that the pixels corresponding to the n-th row enter the selected state.

Due to the operations that are performed in the pixel selection-operation period (n), the unit pixels corresponding to the n-th row enter the selected state and the floating-diffusion unit 504 corresponding to the n-th row, that is, a node connected to the gate of the amplification transistor 505 is reset. Consequently, a signal appearing on the vertical signal line VL after the pixel selection-operation period (n) is finished is the signal corresponding to the reset of the unit pixels 501 corresponding to the n-th row. The above-described signal includes a random noise occurring due to an offset included in the amplification transistor 505 itself and/or the reset of the gate of the amplification transistor 505.

When a signal PC0R reaches a high level in a pulse-like manner subsequent to the pixel selection-operation period (n), the clamp-control switch 515 is temporarily brought into conduction in accordance with the high-level signal PC0R. When the clamp-control switch 515 is brought into conduction, the non-inverting input terminal and the output terminal of the operational amplifier 512 are short-circuited so that the operational amplifier 512 operate as a voltage follower. Consequently, the potential of a terminal of an input capacity, the terminal being connected to the non-inverting input terminal of the operational amplifier 512, becomes a potential attained by superimposing the offset of the operational amplifier 512 on the reference voltage VREF. Then, when the signal PC0R is shifted to a low level, the difference between a potential attained by resetting the unit pixels 501 corresponding to the n-th row and that attained by superimposing the offset of the operational amplifier 512 on the reference voltage VREF is maintained between both the terminals of the input capacity 513.

Next, the signal PTN reaches a high level in a pulse-like manner so that an output signal transmitted from the column-amplification unit 511 at that time is stored in the memory 517n. The signal stored in the memory 517n includes the offset of the operational amplifier 512.

Next, when the signal PTX(n) reaches a high level in a pulse-like manner, the transfer transistor 503 included in each of the unit pixels 501 corresponding to the n-th row is temporarily brought into conduction. Therefore, an electric charge accumulated in the photoelectric conversion unit 502 is transferred to the floating-diffusion unit 504. Consequently, a signal appears on the vertical signal line VL is changed. At that time, the difference between the potentials of both the terminals of the input capacity 513 is maintained because the signal PC0R is at a low level. Accordingly, only the signal corresponding to the potential change of the vertical signal line VL is transmitted to the operational amplifier 512. That is to say, the above-described random noise occurring due to the offset included in the amplification transistor 505 itself and/or the reset of the gate of the amplification transistor 505 is not transmitted to the operational amplifier 512.

After that, the signal PTS reaches a high level in a pulse-like manner so that a signal attained at that time is stored in the memory 517s. The signal stored in the memory 517s includes the offset of the operational amplifier 512 in addition to the potential change of the vertical signal line VL.

When the signal PH reaches a high level in the horizontal scan period (n), the signal stored in each of the memories 517s and 517n is transmitted to the fully-differential amplifier 520 and the signal corresponding to the difference between the two signals is externally transmitted from output terminals outp and outn. Since each of the signals that are stored in the memories 517s and 517n includes the offset of the operational amplifier 512, the signal externally transmitted from each of the output terminals outp and outn does not include the offset of the operational amplifier 512.

After that, the horizontal scan period (n) is followed by a pixel read period (n+1) and a horizontal scan period (n+1). Since operations performed in the pixel read period and the horizontal scan period are equivalent to those performed in the pixel read period (n) and the horizontal scan period (n), the descriptions thereof are omitted.

In the above-described embodiment, any one of the fully-differential amplifiers that are described in the first to fourth embodiments is used. Therefore, the above-described embodiment allows for setting the power voltage to a low level and/or increasing the signal amplitude as is the case with the first to fourth embodiments. Therefore, the power consumption of the photoelectric conversion apparatus 500 can be reduced with facility.

Sixth Embodiment

Figure 7:
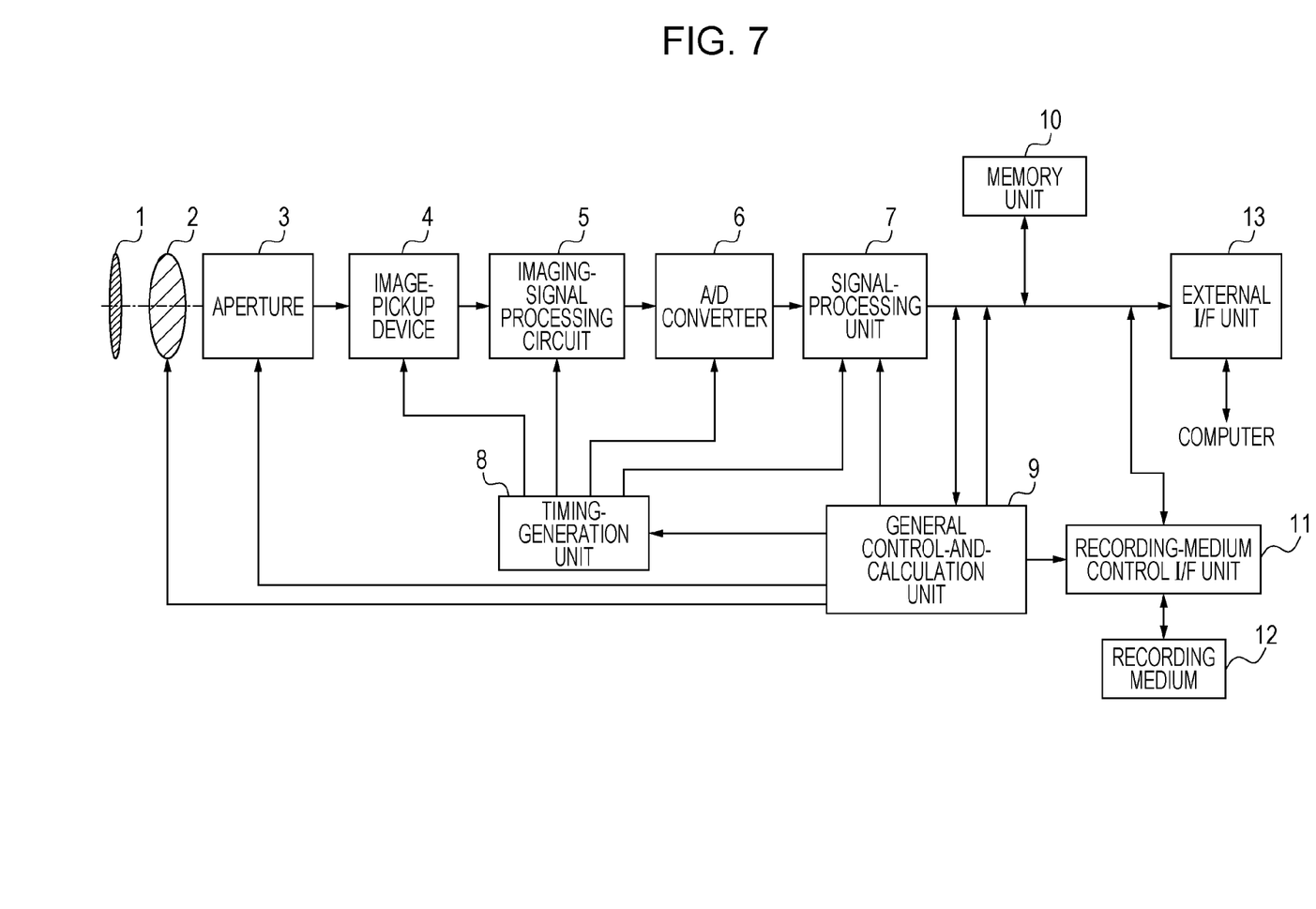
FIG. 7 illustrates an exemplary configuration of an image-pickup system according to a sixth embodiment of the present invention.

An embodiment of the present invention, where a photoelectric conversion apparatus including a fully-differential amplifier according to an embodiment of the present invention is provided in an image-pickup system as an image-pickup device, will be described in detail. The image-pickup system includes a digital still camera, a digital camcorder, a monitoring camera, and so forth. FIG. 7 is a block diagram illustrating an exemplary image-pickup system including a photoelectric conversion apparatus provided in a digital still camera.

FIG. 7 shows a barrier 1 provided to protect a lens, a lens 2 provided to form the optical image of a subject in an image-pickup device 4, and an aperture 3 provided to make the amount of light passing through the lens 2 variable. FIG. 7 also shows an analog-to-digital (A/D) converter 6 provided to perform A/D conversion for an imaging signal externally transmitted from the image-pickup device 4 and a signal-processing unit 7 provided to perform various types of corrections and/or compression for imaging data externally transmitted from the A/D converter 6. FIG. 7 also shows a timing-generation unit 8 provided to externally transmit various types of timing signals to the image-pickup device 4, the an imaging-signal processing circuit 5, the A/D converter 6, and the signal-processing unit 7, and a general control-and-calculation unit 9 provided to control various types of calculations and the entire digital still camera. FIG. 7 also shows a memory unit 10 provided to temporarily store image data, an interface unit 11 provided to record and/or read data in and/or from a recording medium, a removable recording medium 12 such as a semiconductor memory in and/or from which imaging data is recorded and/or read, and an interface unit 13 provided to communicate with an external computer or the like. The timing signal may be transmitted from outside, and the image-pickup system should include at least the image-pickup device 4 and the signal processing unit 7 provided to process an imaging signal externally transmitted from the image-pickup device 4. Thus, a photoelectric conversion apparatus according to an embodiment of the present invention may be used for an image-pickup system. The use of a photoelectric conversion apparatus including a fully-differential amplifier according to an embodiment of the present invention for an image-pickup system allows for decreasing the power voltage of the image-pickup system and/or increasing the amplitude of a signal externally transmitted from an image-pickup device with facility.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-245812 filed on Oct. 26, 2009, which is hereby incorporated by reference herein in its entirety.

What is claimed is:

1. A fully-differential amplifier provided with a positive-phase input terminal, a negative-phase input terminal, a positive-phase output terminal, and a negative-phase output terminal, the fully-differential amplifier comprising:

a positive-phase input transistor having a gate terminal connected to the positive-phase input terminal;

a negative-phase input transistor having a gate terminal connected to the negative-phase input terminal;

first and second resistance elements that are provided to connect a source terminal of the positive-phase input transistor and a source terminal of the negative-phase input transistor;

a third resistance element provided to connect the source terminal of the positive-phase input transistor to the positive-phase output terminal; and a fourth resistance element provided to connect the source terminal of the negative-phase input transistor to the negative-phase output terminal, wherein the first and third resistance elements are connected in parallel with each other between the source terminal of the positive-phase input transistor and a power terminal, and wherein the second and fourth resistance elements are connected in parallel with each other between the source terminal of the negative-phase input transistor and a power terminal.

2. The fully-differential amplifier according to claim 1, further comprising:
   a first operational amplifier; and
   a second operational amplifier,
   wherein a non-inverting input terminal of the first operational amplifier is connected to the positive-phase input terminal, an inverting input terminal of the first operational amplifier is connected to the source terminal of the positive-phase input transistor, and an output terminal of the first operational amplifier is connected to the gate terminal of the positive-phase input transistor, and
   wherein a non-inverting input terminal of the second operational amplifier is connected to the negative-phase input terminal, an inverting input terminal of the second operational amplifier is connected to the source terminal of the negative-phase input transistor, and an output terminal of the second operational amplifier is connected to the gate terminal of the negative-phase input transistor.

3. The fully-differential amplifier according to claim 1, wherein a resistance value of each of the first and second resistance elements and/or each of the third and fourth resistance elements is variable.

4. The fully-differential amplifier according to claim 3, wherein the first and second resistance elements include at least two resistance elements that are parallel with each other with respect to a path provided between the source terminal of the positive-phase input transistor and the source terminal of the negative-phase input transistor.

5. The fully-differential amplifier according to claim 3,
   wherein the third resistance element includes at least two resistance elements that are parallel with each other, and
   wherein the fourth resistance element includes at least two resistance elements that are parallel with each other.

6. The fully-differential amplifier according to claim 1, wherein the first and second resistance elements are provided as a same resistance element.

7. A photoelectric conversion apparatus comprising the fully-differential amplifier according to claim 1.

8. An image-pickup system comprising:
   the photoelectric conversion apparatus according to claim 7; and
   a signal processing unit configured to process an imaging signal externally transmitted from the photoelectric conversion apparatus.

9. The fully-differential amplifier according to claim 6, wherein the first and second resistance elements are respectively connected to the power terminal via a current source.

10. A fully-differential amplifier provided with a positive-phase input terminal, a negative-phase input terminal, a positive-phase output terminal, and a negative-phase output terminal, the fully-differential amplifier comprising:
    a positive-phase input transistor having a gate terminal connected to the positive- phase input terminal;
    a negative-phase input transistor having a gate terminal connected to the negative- phase input terminal;
    first resistance element provided to connect a source terminal of the positive- phase input transistor and a source terminal of the negative-phase input transistor;
    a third resistance element provided to connect the source terminal of the positive- phase input transistor to the positive-phase output terminal; and
    a fourth resistance element provided to connect the source terminal of the negative-phase input transistor to the negative-phase output terminal,
    a positive-phase output transistor having a gate terminal connected to the drain terminal of the positive-phase input terminal, and a drain terminal connected to the positive-phase output terminal; and
    a negative-phase output transistor having a gate terminal connected to the drain terminal of the negative-phase input terminal, and a drain terminal connected to the negative-phase output terminal;
    wherein both ends of each of the first, third, and fourth resistance elements are connected to a power terminal via a respective current source.

11. A photoelectric conversion apparatus comprising the fully-differential amplifier according to claim 10.

12. An image-pickup system comprising:
    the photoelectric conversion apparatus according to claim 7; and
    a signal processing unit configured to process an imaging signal externally transmitted from the photoelectric conversion apparatus.

* * * * *